(12) United States Patent
Gislon

(10) Patent No.: US 12,051,764 B2
(45) Date of Patent: Jul. 30, 2024

(54) CLEAVING APPARATUS AND METHOD FOR CLEAVING SEMICONDUCTOR CELLS, SYSTEM FOR PRODUCING A SHINGLED SOLAR CELL ARRANGEMENT

(71) Applicant: APPLIED MATERIALS ITALIA S.R.L., San Biagio di Callalta (IT)

(72) Inventor: Daniele Gislon, Venice (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 1029 days.

(21) Appl. No.: 16/962,795

(22) PCT Filed: Jan. 18, 2018

(86) PCT No.: PCT/EP2018/051207
§ 371 (c)(1),
(2) Date: Jul. 16, 2020

(87) PCT Pub. No.: WO2019/141363
PCT Pub. Date: Jul. 25, 2019

(65) Prior Publication Data
US 2021/0036180 A1 Feb. 4, 2021

(51) Int. Cl.
*H01L 31/18* (2006.01)
*H01L 21/67* (2006.01)
*H01L 31/042* (2014.01)

(52) U.S. Cl.
CPC ........ *H01L 31/1876* (2013.01); *H01L 31/042* (2013.01); *H01L 21/67011* (2013.01);
(Continued)

(58) Field of Classification Search
CPC ............... H01L 31/042; H01L 31/1876; H01L 31/1892; H01L 2221/67; H01L 2221/683;
(Continued)

(56) References Cited

U.S. PATENT DOCUMENTS 4,195,758 A * 4/1980 Morgan .................. B26F 3/002
225/3
5,171,717 A * 12/1992 Broom ................. B28D 5/0029
438/33
(Continued)

FOREIGN PATENT DOCUMENTS

JP 59117235 A * 7/1984 ............. H01L 21/78
WO 2017/190800 A1 11/2017

OTHER PUBLICATIONS

International Search Report and Written Opinion, PCT/EP2018/051207, Sep. 14, 2018.

*Primary Examiner* — Philip C Tucker
*Assistant Examiner* — Brian R Slawski
(74) *Attorney, Agent, or Firm* — Patterson + Sheridan, LLP

(57) ABSTRACT

An apparatus for separating a semiconductor cell, the apparatus includes a holding arrangement comprising a first holder section and a second holder section, the first holder section being configured to support a first section of the semiconductor cell, and the second holder section being configured to support a second section of the semiconductor cell, and a displacement arrangement configured to separate the first section of the semiconductor cell from the second section of the semiconductor cell by displacing the first section relative to the second section.

10 Claims, 7 Drawing Sheets

(52) U.S. Cl.
CPC ............... *Y02E 10/50* (2013.01); *Y02P 70/50* (2015.11); *Y10T 156/1052* (2015.01); *Y10T 156/1082* (2015.01)

(58) Field of Classification Search
CPC ..... H01L 2221/68304; H01L 21/67011; H01L 21/67092; H01L 21/02; H01L 21/02002; H01L 21/02005; Y02E 10/50; Y02P 70/50; Y10T 156/1052; Y10T 156/1082; B65G 47/90; B65G 47/91; B65G 47/92; B65G 47/94; B65G 47/88; B65G 47/22; B65G 47/26; B65G 47/30; B65G 47/31
USPC ....... 438/460, 462, 464, 584, 597, 610, 907, 438/974, FOR. 385, FOR. 386; 198/465.1, 345.3, 688.1, 689.1, 690.1, 198/691; 414/222.01, 225.01, 935, 936, 414/941
See application file for complete search history.

(56) References Cited

U.S. PATENT DOCUMENTS

| | | | | |
|---|---|---|---|---|
| 5,719,077 | A * | 2/1998 | Chakrabarti | B28D 5/0017 225/101 |
| 6,171,933 | B1 * | 1/2001 | Xu | B28D 5/0052 225/5 |
| 2017/0077343 | A1 * | 3/2017 | Morad | H01L 31/0747 |
| 2018/0190860 | A1 * | 7/2018 | Winger | H01L 21/6838 |

* cited by examiner

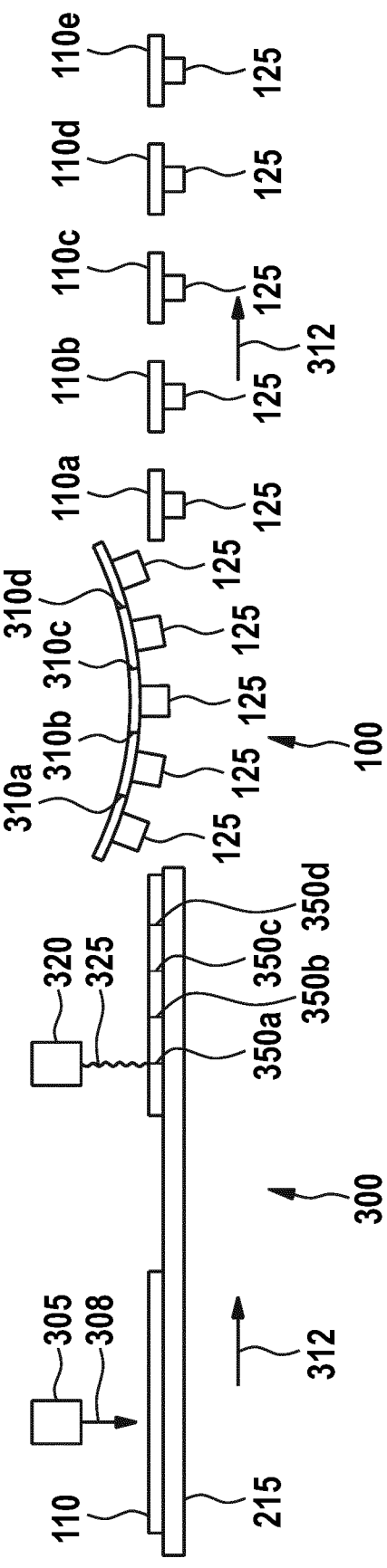

US 12,051,764 B2

CLEAVING APPARATUS AND METHOD FOR CLEAVING SEMICONDUCTOR CELLS, SYSTEM FOR PRODUCING A SHINGLED SOLAR CELL ARRANGEMENT

TECHNICAL FIELD

Embodiments of the present disclosure relate to an apparatus for separating a semiconductor cell into two or more pieces, and a method for separating a semiconductor cell into two or more pieces. Embodiments of the present disclosure particularly relate to a system for producing at least one shingled solar cell arrangement.

BACKGROUND

Solar cells are electrical components that convert radiation energy, in particular sunlight, directly into electrical power. Beside the material the design of the solar cell has an important effect on the efficiency of the cell. A distinction is made between solar cells according to the surface textures, the contacts on the front and back side and the layer structures of the cell. The efficiency of a solar cell can be affected by an active area on a front surface of the solar cell, wherein the front surface is exposed to the sunlight for converting sunlight into electrical power. The active area can be reduced due to the presence of electrical contacts, such as fingers and/or bus bars, on the front surface of the solar cells. The presence of the electrical contacts on the front surface of the solar cell can thus reduce a module power of a solar cell module consisting of the solar cells.

Shingled solar cell arrangement can increase the output power of a solar cell module. The increase in the output power can be affected by the quality of a manufacturing process, such as the quality of the cell pieces, particularly of separated cell sections used to assemble the shingled solar cell arrangement. Further, a proper assembling of the shingled solar cell arrangement can be cumbersome, and a throughput and/or yield can be low.

In view of thereof, the present disclosure aims at providing apparatuses and a method for cleaving a solar cell into single solar cell pieces having high quality, in particular high efficiency, at high speed.

SUMMARY

In light of the above, an apparatus for separating a semiconductor cell into two or more pieces, a system for producing at least one shingled solar cell arrangement, a cleaving apparatus and a method for separating a semiconductor cell into two or more pieces is provided.

According to an aspect of the present disclosure, an apparatus for separating a semiconductor cell is provided. The apparatus includes a holding arrangement including a first holder section and a second holder section, the first holder section being configured to support a first section of the semiconductor cell, and the second holder section being configured to support a second section of the semiconductor cell, and a displacement arrangement configured to separate the first section of the semiconductor cell from the second section of the semiconductor cell by displacing the first section relative to the second section.

According to further aspect of the present disclosure, a system for producing at least one shingled solar cell arrangement is provided. The system includes an adhesive applying device for applying glue on the surface of a semiconductor cell, a scribing device, an apparatus for separating the semiconductor cell of other embodiments described herein, and a transporting configuration for semiconductor cells forming a transport connection between the adhesive applying device, the perforation device and the apparatus for separating the semiconductor cell.

According to a further aspect of the present disclosure, a semiconductor cell separation apparatus is provided. The semiconductor cell separation apparatus includes a displacement arrangement having a first support surface and a second support surface, a first holder section arranged on the first support surface, and a second holder section arranged on the second support surface, wherein the first support surface is displaceable relative to the second support surface.

According to a further aspect of the present disclosure a method for separating a semiconductor cell is provided. The method includes attaching a first section of the semiconductor cell to a first holder section and a second section of the semiconductor cell to a second holder section, and separating the semiconductor cell by displacing the first supported section relative to the second supported section of the semiconductor cell

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following figures:

FIG. 11 shows a schematic side view of an exemplary system for producing at least one shingled solar cell arrangement.

DETAILED DESCRIPTION OF EMBODIMENTS

Figure 1A:
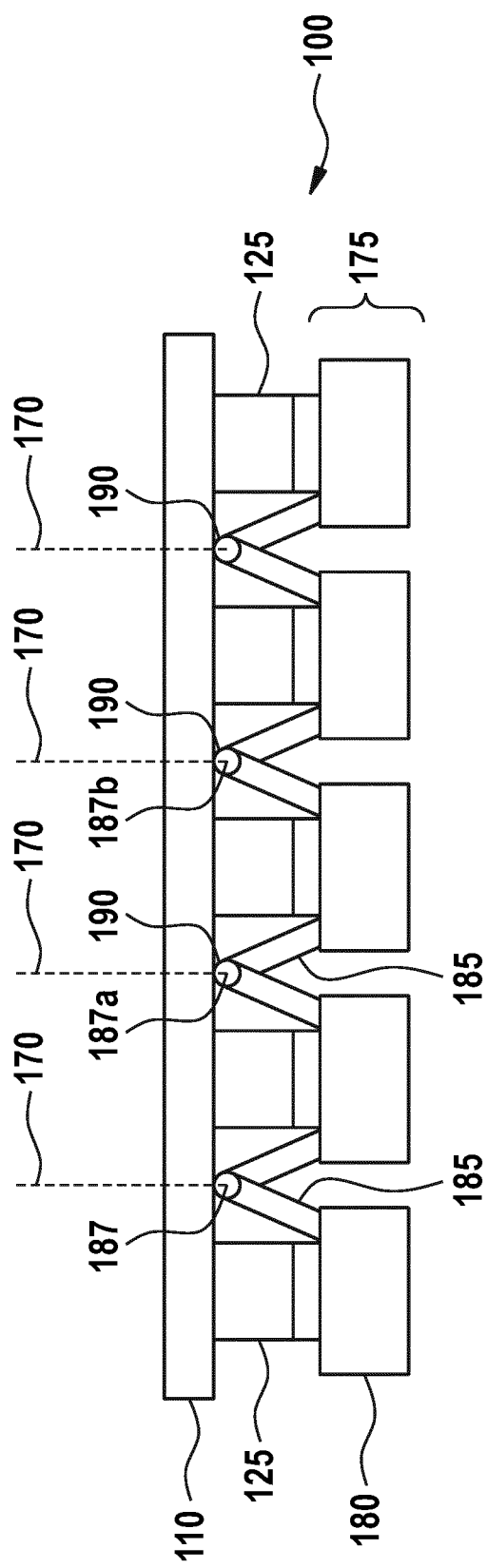
FIG. 1A shows a schematic side view of an exemplary embodiment of an apparatus including a displacement arrangement.

Reference will now be made in detail to the various embodiments of the disclosure, one or more examples of which are illustrated in the figures. Within the following description of the drawings, the same reference numbers referring to individual embodiments are described. Each example is provided by way of explanation of the disclosure and is not meant as a limitation. Further features illustrated or described as a part of one embodiment can be used on or in conjunction with other embodiments to yield a further embodiment. It is intended that the description includes such a modification and variations.

In the production of solar cells, apparatuses for separating a semiconductor cell into two or more sections are used to produce separated semiconductor pieces for solar cell arrangements. According to embodiments a holding arrangements including a first holder section and a second holder section is provided. The first holder section is configured to support a first section of the semiconductor cell, and the second holder section is configured to support a second section of the semiconductor cell. The term semiconductor cell as used herein may be an electronic component, in particular a solar cell. Typically, the terms semiconductor cell, solar cell and cell are used synonymously.

A holding arrangement can be understood as a supporting structure for supporting the holder sections. The holding arrangement can be movable to adjust the holder sections with respect to the semiconductor cell. The holding arrangement can include individual controllable support arms, wherein one holder section can be fixed on one support arm.

The term holder section can be understood as any device configured for supporting at least a part of the semiconductor cell. The term supporting can be also understood as mounting, taking or holding and the like. The holding section can be configured to apply a holding force to the semiconductor cell. The holding force can be applied by mechanical forces or a combination of different mechanical forces like gripping, clamping, pushing or pressing and the like. The holding force can be applied to any areas of the semiconductor cell like the edge surfaces, the upper side or the bottom side surfaces of the semiconductor cell. Furthermore the holding force can be exerted by stationary surface forces for example by suction pads. Moreover the holding force can be applied dynamically to the semiconductor cell for example by negative pressure or by electro-magnetic force. Using holding forces applied by negative pressure or by electro-magnetic force can be beneficial due to the capability to turn on and switching off the holding forces of the holding section. Furthermore a holder section can also provide one or more contact surfaces just for supporting the semiconductor cell without actively exert a force to a surface of the semiconductor cell.

A holder section can include a single holder element or more holder elements. The terms holder element and holder can be used synonymously. A holder element can apply a holding force to the semiconductor cell or just providing a support surface as describe herein. The term holder element and the term holder can be used synonymously. The holding force applied by the holder elements can be controlled separately or the holding force applied by the holder elements can be controlled together for more than one holder elements, in particular for all holder elements. The first holder section can be understood as a holder section being assigned to the first section of the semiconductor cell and the second holder section can be understood as a holder section being assigned to the second section of the semiconductor cell. The first and the second holder section can be arranged next to each other, in particular adjacent to each other at the holding arrangement.

According to embodiments a displacement arrangement is provided. The displacement arrangement is configured to separate the first section of the semiconductor cell from the second section of the semiconductor cell by displacing the first section relative to the second section. A displacement arrangement can be understood as a device configured to move the first section of the semiconductor cell relative to the second section of the semiconductor cell. The displacement arrangement can also be seen as a cleaving arrangement. The semiconductor sections can be for example pulled apart from each other or shifted relatively to each other. The displacement arrangement applies a mechanical force to the first and the second section of the semiconductor cell by the above described movement. In particular, a mechanical stress is applied to the semiconductor at the boundary surface of the cell enclosed between the first and the second section of the cell. The mechanical stress applied at the boundary surface can cause the semiconductor cell sections to separate from each other, in particular to break or to split up into a first separated and a second separated section of the semiconductor cell.

The term a first separated section of the cell can be used synonymously with the term a first separated cell piece or a first cell piece or a first piece of the semiconductor cell. Analogously, the term a second separated section of the cell can be used synonymously with the term a second separated cell piece or a second cell piece or a second piece of the semiconductor cell.

According to embodiments which can be combined with other embodiments of other aspects described herein, a semiconductor cell separation apparatus is provided. The semiconductor cell apparatus includes a displacement arrangement having a first support surface and a second support surface, a first holder section arranged on the first support surface and a second holder section arranged on the second support surface, wherein the first support surface is displaceable relative to the second support surface.

According to embodiments, which can be combined with other embodiments described herein, the displacement arrangement can include a flexible strip. The term strip as used herein may be a textile, a ribbon, a tape, a band or the like, wherein the strip can be rectangular shaped. In particular, the strip can also have an elongated rectangular design. The strip can be fixed to at least two suspension points, in particular can be hold under mechanical tension between the suspension points. The strip can form a substantially flat or level surface, wherein the semiconductor cell can be put on the surface formed by the strips. The term flexible can be understood such as the strip can be stretchable, pull-able, extendable, compress-able, or the like. The shape of the flexible strip can be changed in a horizontal direction or in vertical direction. The flexible strip can, for example, take a bent-like, or curved-like shape, wherein the surface supporting the semiconductor cell has a curved shape. A curved or bend-like surface can apply a mechanical stress to the semiconductor cells supported by the surface of the strip.

The strip can consist of two or more strands. The strip can have openings or recesses, wherein the edges of the openings can be, for example, formed by the strands. According to embodiments, the holding arrangement can be arranged within the openings. For example, the first and the second holder section can be arranged at the openings of the strip or can reach through the openings for supporting the semiconductor cell. According to some embodiments, the holding arrangement, in particular the first and the second holder section can be integrated or arranged within the flexible strip.

According to embodiments, which can be combined with other embodiments, the displacement arrangement comprises two or more members having a support surface for supporting the first and the second section of the semiconductor cell, each member being linked to each other and being mutually displaceable. A member can be understood as a subunit of the displacement arrangement. A member can include a member body, in particular a solid member body, providing at least one support surface for supporting a section of the semiconductor cell. The support surface can be a flat surface, wherein the support surface can be a continuous area or the support surface can consist of more than one partial surfaces. Each member being linked to each other can be understood that each of the members are connected by a joint or a hinge with each other. The linked members can form a chain-like displacement arrangement, wherein the individual support surfaces of each member can be oriented different from each other. The members can apply a force to the supported semiconductor cells by changing the orientation of some or all of the members with respect to each other.

FIG. 1A shows a schematic side view of an exemplary embodiment of an apparatus including a displacement arrangement 175. The displacement arrangement 175 having a plurality of members 180, wherein each member 180 includes rods 185 connected by a joint 187. The joints 187 forming a flexible connection, in particular a swivel connection between each member 180 and each member 180 can be rotated against each other, wherein the pivot point between two rotated members is formed by the respective joint 187. The joints 187 include a support surface 190, wherein the semiconductor cell 110 be supported on top of the support surfaces 190. The distance between two joints 187a and 187b of two adjacent members can define the lengths of the semiconductor section to be separated. The dashed lines 170 showing the size or the lengths of the semiconductor sections corresponding the respective joints 187. The bottom surface 160 of the semiconductor cell 110 is in contact with the support surfaces 190 of the members 180.

The apparatus 100 includes holders 125 which are attached on the bottom surface 160 of the semiconductor cell 110. The holders 125 can be arranged on the member 180, wherein the holders 125 can be moved by the movement of the members 180. According to the embodiment depicted in FIG. 1A each member 180 includes one single holder 125, wherein the holders 125 are arranged on top of each member 180. According to embodiments, the holders 125 can also be moved or actuated independently from the displacement arrangement 175. By rotating the members 180 against each other a force is applied to the semiconductor cell 110 as described herein to separate the semiconductor cell 110.

According to embodiments, which can be combined with other embodiments described therein, the holding arrangement is arranged on the displacement arrangement. The holding arrangement including the first and the second holding section can also be at least partly arranged on the displacement arrangement. For example, either the first holder section or the second holder section of the holding arrangement can be arranged on the displacement arrangement. The term being arranged can be understood as the holder arrangement is fixed or attached or mounted or the like at the displacement arrangement. The holding arrangement can be connected to the displacement arrangement, wherein the holding arrangement can be moved or actuated by the displacement arrangement.

According to embodiments, which can be combined with other embodiments, the holding arrangement can be at least temporarily attached to the displacement arrangement. The term temporarily attached can be understood that the holding arrangement have a connecting position, wherein the holding arrangement forms a connection with the displacement arrangement, in particular the first and the second holder section forms a connection with the displacement arrangement. The holding arrangement and the displacement arrangement can act as a single unit while being in the connecting position. The connecting position can be for example achieved by a snap-in connection, wherein the holding arrangement is firmly attached to the displacement arrangement. The connecting position can be transferred in a disengaged position by detaching the holding arrangement from the displacement arrangement.

According to embodiments, which can be combined with other embodiments described herein, the holding arrangement comprises three or more holder sections configured to support three or more sections of the semiconductor cell, and the displacement arrangement being configured to displace three or more sections of the semiconductor cell relative of each other. Using a plurality of holder sections and a displacement arrangement being configured to displace a plurality of sections of the semiconductor cell can simplify the separating process of the semiconductor cell. In particular, the displacement arrangement described herein can be configured to displace several cell sections of a multitude of cell sections or to displace all sections of the semiconductor cell simultaneously. By displacing the different cell sections simultaneously the separating process of the cell can be speed up.

According to embodiments, which can be combined with other embodiments described herein, the semiconductor cell can include four sections, wherein the displacement arrangement can be configured to separate four semiconductor cell sections by displacing the sections relative to each other. The four semiconductor sections can be supported by the holding arrangement including four holder sections. According to another exemplary embodiment the semiconductor cell can include six semiconductor cell sections, wherein the displacement arrangement is configured to separate six cell sections and the holding arrangement including six holder sections configured to support the semiconductor cell sections.

Figure 1B:
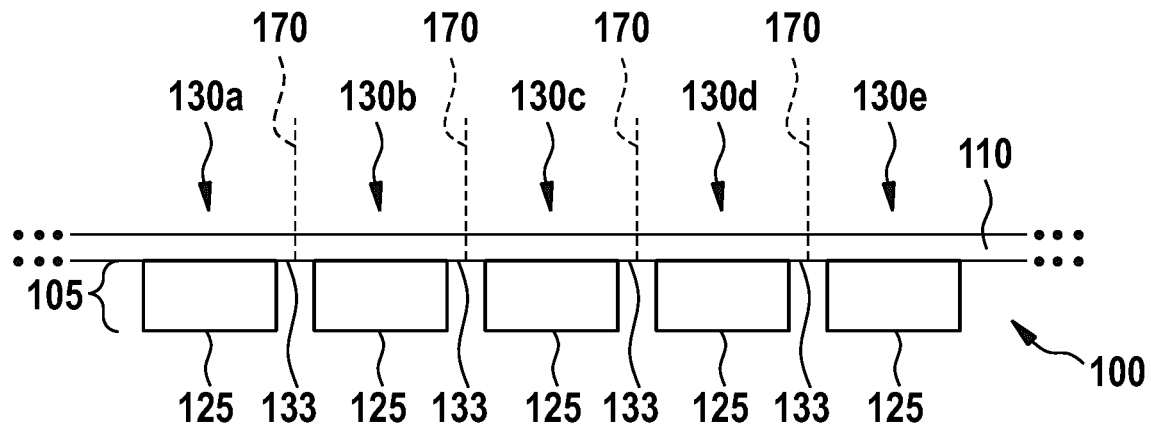
FIG. 1B shows a scheme of an exemplary apparatus for separating a semiconductor cell is shown.

With reference to FIG. 1B, a scheme of an exemplary apparatus 100 for separating a semiconductor cell 110 is shown. The apparatus 100 includes a holding arrangement 105 for holding the semiconductor cell 110. The holding arrangement 105 is arranged at the bottom surface of the semiconductor cell 110. The holding arrangement 105 includes several holder sections 125, wherein each section 130a-130e of the semiconductor cell 110 is individually supported by a holding section 125. The boundaries 133, in particular the boundary areas 133 between the sections 130a-130e of the cell 110 are depicted by the dashed lines 170. The boundaries 133 can be understood as the fracture points or breaking points of the semiconductor cell. The boundaries 133 can be determined by the apparatus 100 or by devices (not shown) included in the apparatus.

Figure 4:
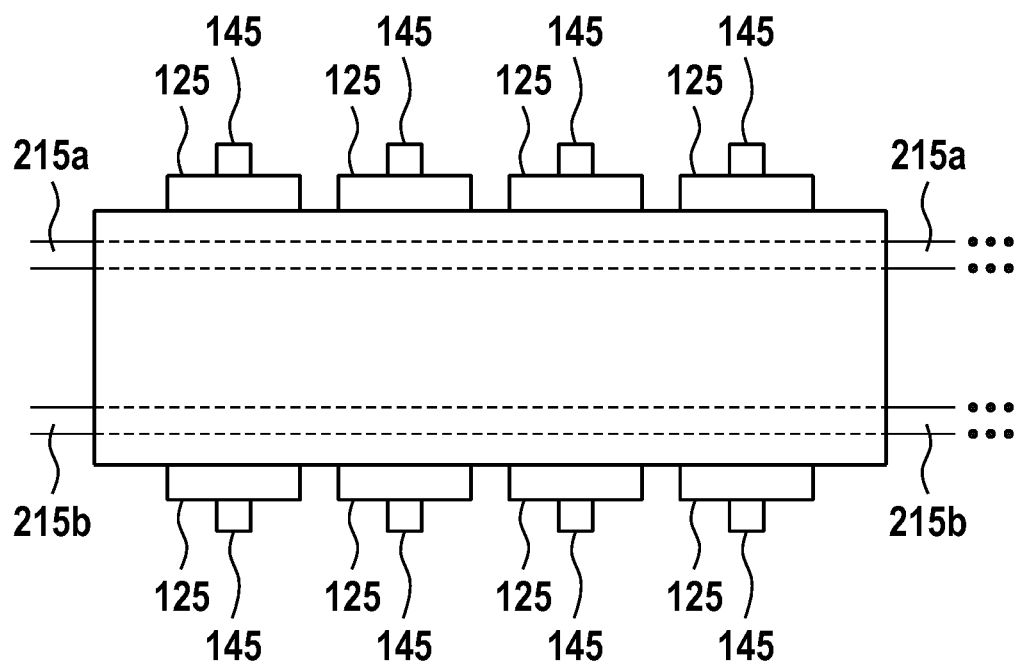
FIG. 4 shows a schematic top view of an exemplary embodiment of an apparatus for separating a semiconductor cell.

According to embodiments, which can be combined with other embodiments described herein, the holder sections are configured to form attachment zones with a surface of the semiconductor cell. Attachment zones can be understood as a defined surface, in particular a defined partial surface of the semiconductor cell being in contact with a cell. At the attachment zone a surface of a holder section is in contact to the semiconductor cell surface and exerts a holding force on the semiconductor cell as described herein. The attachment zone can be defined by the holder section, in particular by the shape or by the design of the holder section or the holder elements included in the holder sections. FIG. 4 shows a schematic top view of an exemplary embodiment of an apparatus 100 for separating a semiconductor cell 110. The semiconductor cell 110 is arranged on top of two conveyor belts 215a and 215b. The holding sections 125 of the holding arrangement 105 supports, in particular attaches the semiconductor cell 110 at the lower side of the sections of the cell. The holding sections 125 include supports 145 for actuating and/or moving and/or transferring the holder sections 125.

Figure 5:
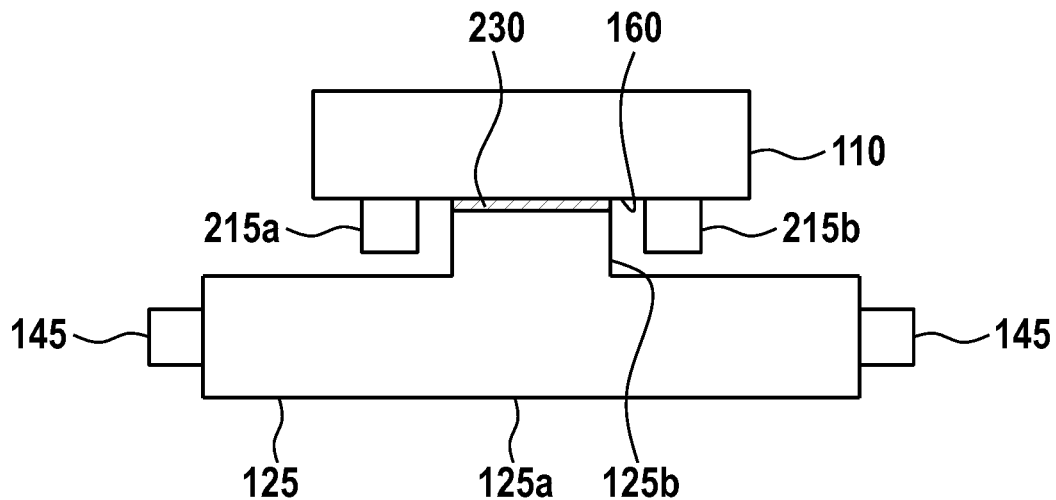
FIG. 5 shows a schematic cross section of an apparatus depicted in FIG. 4; a holder section supported by supports is in contact with the semiconductor cell.

FIG. 5 shows a schematic cross section of an apparatus 100 depicted in FIG. 4. A holder section 125 supported by supports 145 is in contact with the semiconductor cell 110. The holding section 125 forms an attachment zone 230 between the lower side or the bottom side 160 of the semiconductor cell 110. The attachment zone 230 is located between the conveyors 215a and 215b. The holder section 125 can include a holder base body 125a and an upper holder body 125b. The holder base body 125a can be supported by the supports 145. The upper holder body 125b forms the attachment zone 230 with the cell. The upper holder body 125b can be a projection on top of the base holder body. The design of a holder section 125 including an upper holder body 125b and a base body 125a can enable an attachment with the bottom surface of the semiconductor cell by conducting the upper holder body through the two conveyor belts 215a and 215b. According to embodiments, a semiconductor cell about to be separated can be transferred by a conveyor to the holding arrangement. The holding section 125 can be used and controlled independently from the conveyor.

Figure 6:
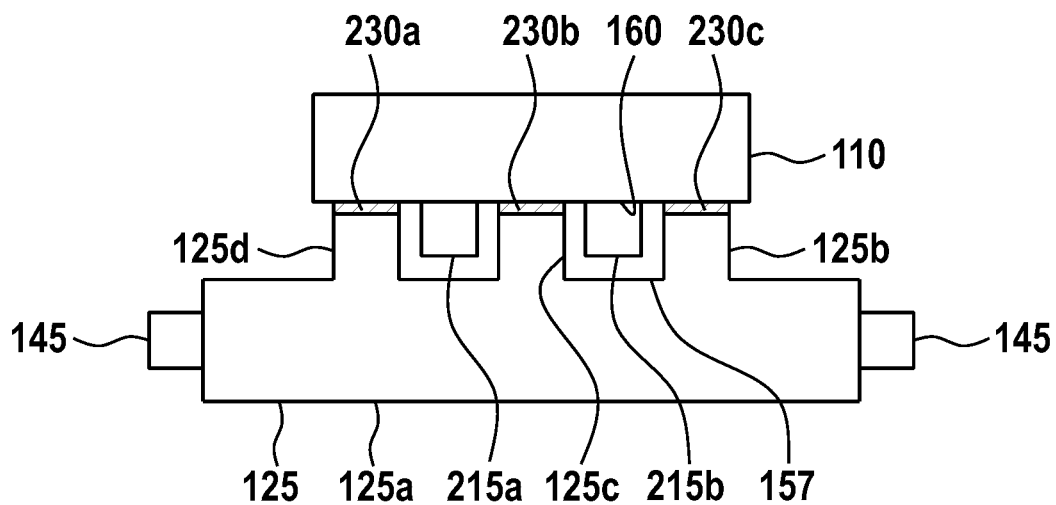
FIG. 6 shows a schematic cross section of another exemplary embodiment of an apparatus depicted in FIG. 4

In FIG. 6 shows a schematic cross section of another exemplary embodiment of an apparatus 100 depicted in FIG. 4. The holder section 125 includes a base holder body 125a and upper holder sections 125b-125d. The holder section can form several attachment zones 230a, 230b and 230c at the lower side 160 of the semiconductor cell. The conveyor belts 215a and 215b are located between the attachment zones. The holder section 215 can form gaps 157 between the upper holder sections 125b-125d and the lower side 160 of the semiconductor cell. The gaps 157 enable an arrangement of further support devices like conveyors, sensors or the like.

According to embodiments, which can be combined with other embodiments described herein, the first holder section and the second holder section are individually movable. The term individually movable can be understood as the first holder section and the second holder section can be moved independently from each other. Individually movable holder sections can support the displacement process by holding the semiconductor cell when the semiconductor cell is separated. The holder sections can also actively displace or rotate the first section relative to the second section of the cell, wherein the holder sections transfer the movement or the rotation of the displacement arrangement to the sections of the semiconductor cell. Furthermore, an individually movable holder section can move a separated semiconductor section after the semiconductor cell was separated.

Figure 8:
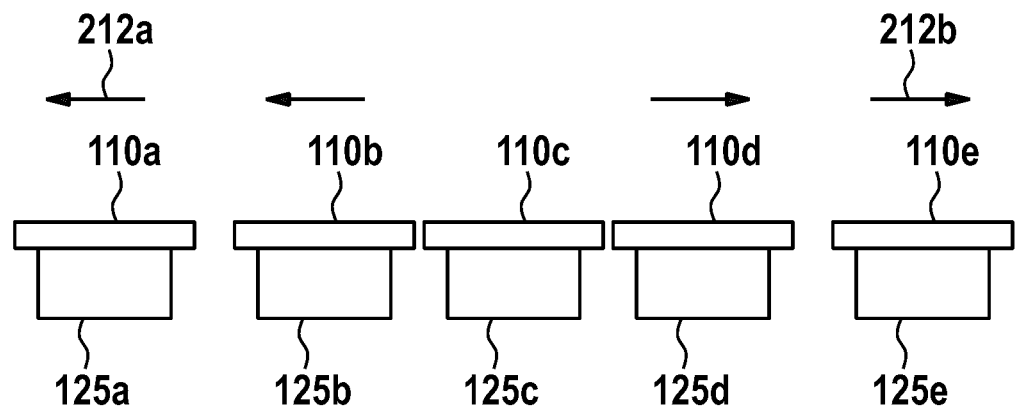
FIG. 8 shows a schematic side view of a separated semiconductor cell, wherein the cell parts of the cell have been cleaved.

FIG. 8 shows a schematic side view of a separated semiconductor cell, wherein the cell parts 110a-110e of the cell have been cleaved as described herein. Each cell part 110a-110e of the cell is arranged on a holder 125a-125e assigned to the respective cell part 110a-110e. The first two holders on the left side 125a and 125b are configured to transfer the cell parts 110a and 110b attached on the respective holders to the left along a first transport direction 212a. The first two holders on the right side 125d and 125e are configured to transfer the cell parts 110d and 110e to the right side a long a second direction 212b. According to embodiments, which can be combined with other embodiments described herein, the holders can transfer all the separated cell sections in the same direction.

According to embodiment, which can be combined with other embodiments described herein, the apparatus includes at least one semiconductor cell scribing device. The scribing device can be understood as a device configured to pretreat the semiconductor cell before the cell is separated by the displacement arrangement. The pretreatment can include perforating, scribing or scratching and the like. The scribing device is configured to generate one or more predetermined breaking points or lines on the semiconductor cell such that the cell can easily be separated or broke into two or more cell pieces. The breaking points or lines can define the first section and the second section of the cell. The scribing device can include a laser or be a laser, wherein the semiconductor cell is scribed by a laser beam generated by the scribing device. According to some embodiments, the breaking points can define a plurality of sections of the semiconductor cells.

According to embodiments a method is provided for separating a semiconductor cell. The method comprises attaching a first section of the semiconductor cell to a first holder section and a second section of the semiconductor cell to a second holder section and separating the semiconductor cell by displacing the first supported section relative to the second supported section of the semiconductor cell.

According to embodiments, the first and the second sections of the semiconductor cell are displaced by bending the semiconductor cell. Bending the semiconductor cell can for example include stretching, compressing, twisting, folding, sagging or deflecting the semiconductor cell. By bending the cell a mechanical force, in particular a mechanical stress is applied to the semiconductor cell, wherein the semiconductor cell can be broke into pieces. The force for bending the semiconductor cell can be applied by the displacement arrangement. The semiconductor cell can be bend by moving the first section of the cell upwards or downwards, wherein the second section of the cell remain in the starting position. It is also possible to move the second section of the cell with respect to the first section of the cell as described before. Moving the first or the second section of the cell upwards can also be understood as pushing the respective section upwards.

Figure 2:
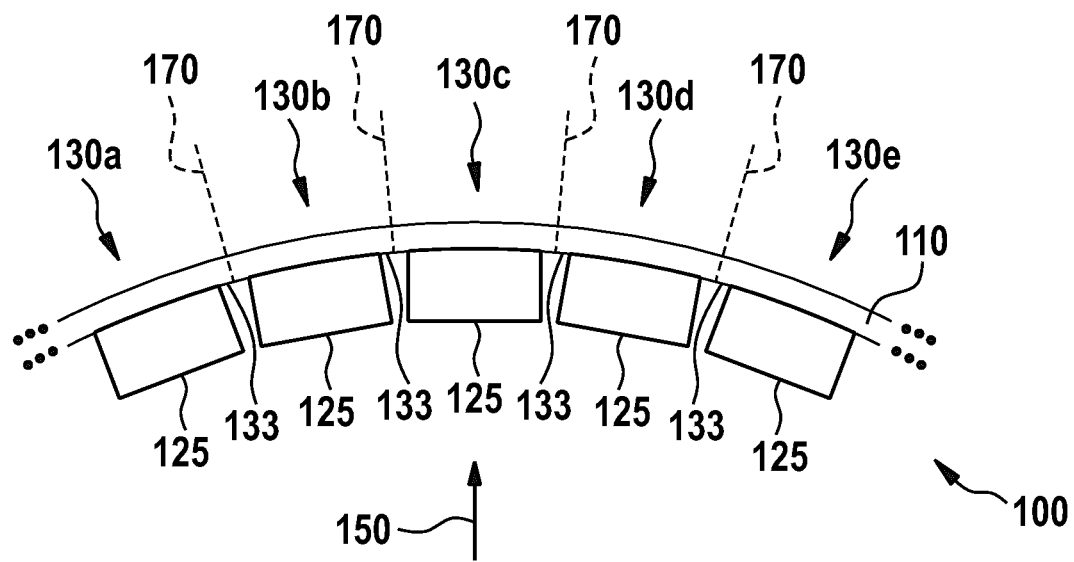
FIG. 2 shows a schematic side view of a bending process in an exemplary embodiment of an apparatus for separating a semiconductor cell.

With reference to FIG. 2, a schematic side view of a bending process in an exemplary embodiment of an apparatus 100 for separating a semiconductor cell is shown. The semiconductor cell 110 is supported by the holding arrangement including a plurality of holders 125, wherein each section 130a-130e of the semiconductor cell 110 is supported by one holder. The holders 125 support the section of the cell 130a-130e symmetrically with respect to the center of each section of the cell. The cell 110 is bend by moving at least one middle section of the semiconductor cell 110 upwards while the peripheral section of the cell are hold in the starting position. In particular, section 130c of the cell 110 is moved or pushed upwards towards a bending direction 150 by the displacement arrangement (not shown). The upwards movement cause the cell to bend upwards or to bulge upwards. The bending causes a mechanical stress to the semiconductor cell 110, especially in the boundary areas 133 between the sections 130a-130e of the cell depicted by the dashed lines 170.

Figure 3:
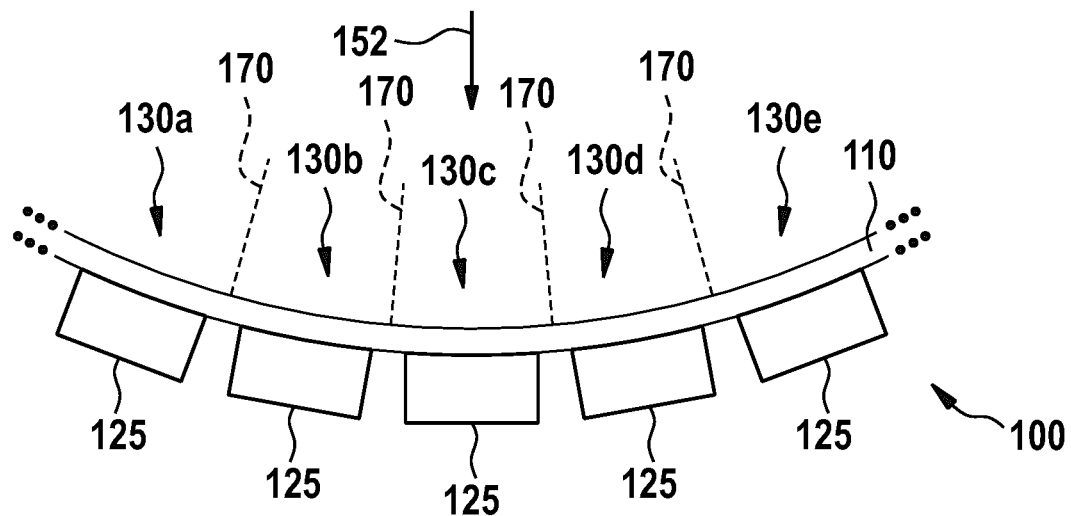
FIG. 3 shows a schematic side view of another bending process in an exemplary embodiment of an apparatus for separating semiconductor cell.

With reference to FIG. 3, a schematic view of another bending process in an exemplary embodiment of an apparatus 100 for separating a semiconductor cell is shown. The bending of the semiconductor cell 110 is similar to the process shown in FIG. 2, wherein the semiconductor cell 110 is moved or bend downwards towards a bending direction 152 by the displacement arrangement (not shown).

According to embodiments, which can be combined with other embodiments described herein, the bending process can include both processes as described before with respect to FIG. 2 and FIG. 3. The bending process can applied just one times, or two or more times until the semiconductor cell is separated. The bending process can also be combined with other procedures for separating or cleaving the first and the second sections of semiconductor cells. According to embodiments, the force for bending the cell is transferred or applied by the displacement arrangement, wherein the bending force can be also be transferred or applied by the holder section arranged on the displacement arrangement.

Figure 10:
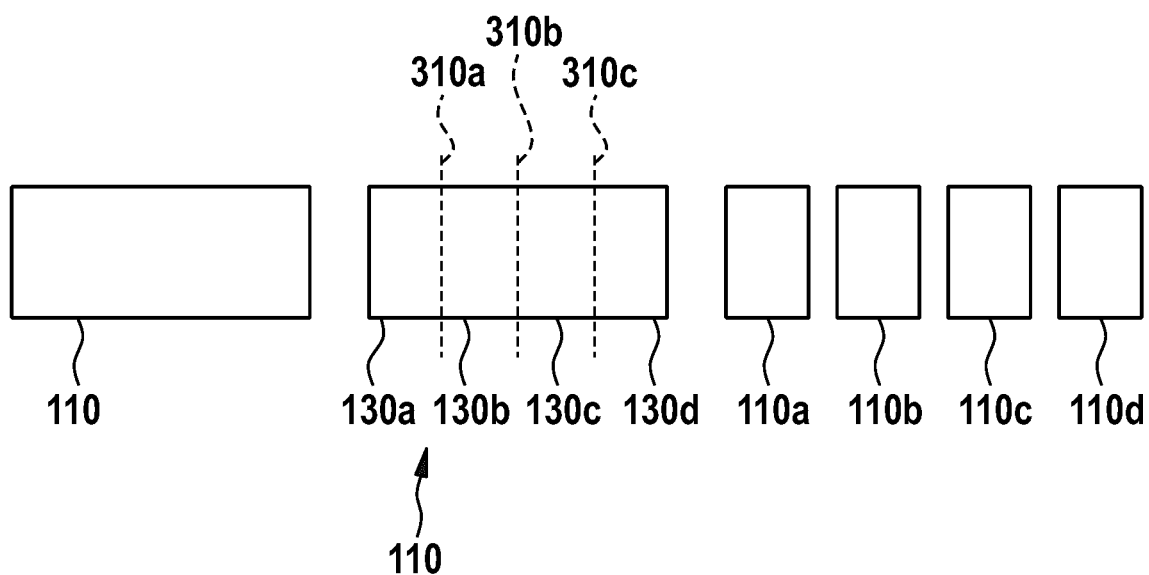
FIG. 10 shows a schematic top view of a separation process of a semiconductor cell.

According to embodiments, which can be combined with other embodiments, described herein, the separated first and second section of the semiconductor cell are individually moved away from the displacement arrangement by the holder section. FIG. 10 shows a schematic top view of a separation process of a semiconductor cell as described herein. The semiconductor cell 110 is moved or transported, for example by a conveyor, to the holding arrangement (not shown). After moving the cell 110 to the holding arrangement, the holder sections of the holding arrangement support the section 130a-130d of the semiconductor cell as described herein. The semiconductor cell 110 is bend, according to embodiments as described herein, along several folding axes 310a-310c until the semiconductor cell 110 breaks along the folding axes. The separated cell parts 110a-110d are transported by the holder section, wherein each holder section, in particular each holder supports one respective cell part.

According to embodiments, the semiconductor cell is scribed to define the sections of the semiconductor cell. Scribing can be carried out by a scribing device as described herein. Scribing can be understood as weakening the structure of the semiconductor cell at predetermined breaking points to facilitate the separation of the cell by the displacement arrangement. Scribing can form breaking points on the cell, in particular of the surface of the cell, wherein the breaking points can have a straight-line design. By scribing the cell can be divided in the first and second cell section before separating. Scribing can also be understood as setting marks at the cell, wherein the cell is aligned on the displacement arrangement and/or on the holding arrangement according to the marks. According to embodiments, the scribing can be carried out by a laser beam.

According to embodiments, which can be combined with other embodiments, described herein, the semiconductor cell is transferred to the holding arrangement by a conveyor. The conveyor can be a flexible conveyor belt including a surface for placing the semiconductor cell on top of it. The conveyor can have a continuous surface or consist of individual strands including recesses between the strands. Having recesses between the different strands can be beneficial for arranging the semiconductor cell at the holding arrangement. The conveyor can consist of two or more conveyor belts, in particular in parallel to each other, according to embodiments as depicted in the FIG. 5 and FIG. 6. The semiconductor cell, in particular the surface of the cell can be for example mechanically treated or treated by laser beam by the scribing device.

Figure 7:
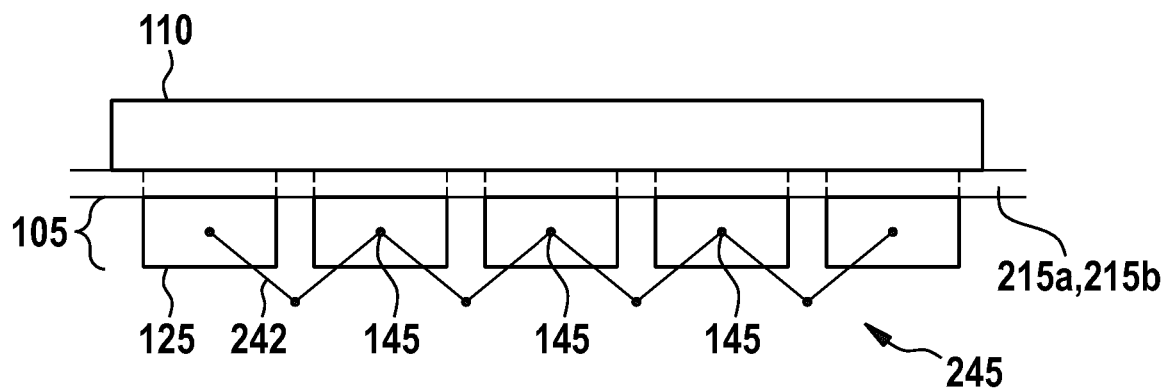
FIG. 7 shows a schematic side view of another embodiment of the apparatus for separating a semiconductor cell including a conveyor.

FIG. 7 shows a schematic side view of another embodiment of the apparatus 100 for separating a semiconductor cell including a conveyor. The cell 110 is placed on top of the conveyor belts 215a and 215b, wherein the conveyor belts transport the cell 110 to the holding arrangement 105. The holding arrangement 105 including a plurality of holders 125 can support with each single holder 125 the bottom surface of the semiconductor cell 110 as describe herein. The holding arrangement 105 can include an actuation system 245 to position the holders 125 at the semiconductor cell 110. The holders 125 can be connected to the actuation system 245 by actuating components 242 and supports 145, wherein the supports 145 link the holders 125 with the actuation system 245 by the actuating components 242. By positioning the conveyor belts 215a, 215b between the cell 110 and the holding arrangement 105 the transport of the cell 110 to the holding arrangement 105 can be facilitated. According to embodiments, the holders 125 supports the cell 110 while being positioned between the conveyor belts 215a, 215b, in particular while being position between the recesses formed by the conveyor belts 215a, 215b.

Figure 9:
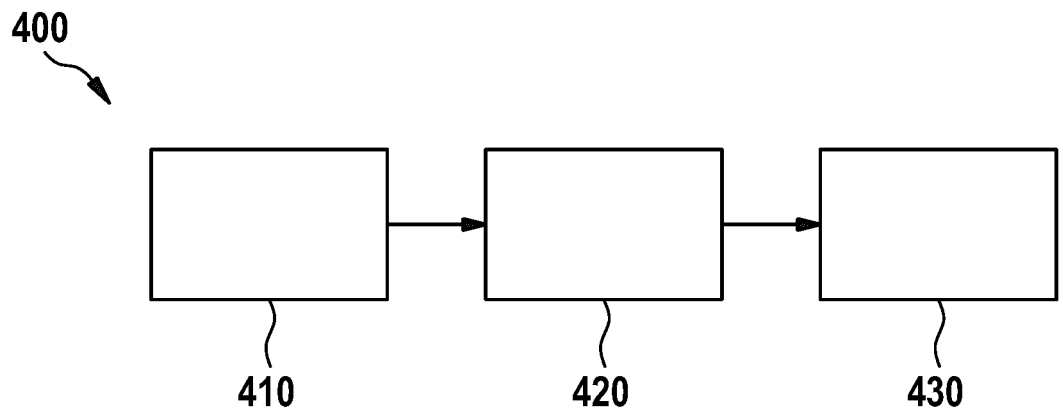
FIG. 9 shows a flow chart of a method of separating a semiconductor cell into at least two pieces.

FIG. 9 shows a flow chart of a method 400 of separating a semiconductor cell into at least two pieces according to embodiments described herein. The method 400 includes supporting 410 a first section of a semiconductor cell by a first holder section and supporting a second holder section of the semiconductor cell by a second holder section. The method further includes separating the first section of the semiconductor cell from the second section of semiconductor by displacing 420 the first section of the semiconductor cell relative to the second section of the semiconductor, and transferring 430 the first separated section of the semiconductor cell by the first holder and the second separated section of the semiconductor cell and the second holder.

FIG. 11 shows a schematic side view of an exemplary system for producing at least one shingled solar cell arrangement. A semiconductor cell 110 is arranged on a transport configuration 215, in particular a conveyor 215. The transport configuration 215 transports the semiconductor cell 110 below an adhesive applying device 305 along a transport direction 312. The adhesive applying device 305 applies a dry adhesive 308, for example a glue, a paste, a deposit or the like on the surface of the semiconductor cell. The adhesive is typically electrically conductive. The semiconductor cell 110 is further transported by the transport configuration 215 to a laser unit 320. The laser unit 320 generates a laser beam 325, wherein the laser beam 325 is directed on the surface of the semiconductor cell. By hitting the surface of the cell 110 the laser beam 325 creates breaking points 350a-350d on the semiconductor cell 110. The breaking points 350a-350d define a plurality of section on the semiconductor cell, in particular a first, a second section and further sections of the cell.

The semiconductor cell 110 is further transported to an apparatus 100 for separating the semiconductor cell 110 according to embodiments described herein. The semiconductor cell 110 is cleaved by bending the semiconductor cell in the apparatus along several folding axes 310a to 310d. The folding axes 310a-310b go along, in particular correspond with the breaking points 350a-350d. The semiconductor cell 110 is supported by several holders 125, wherein each holder 125 is attached to a section of the semiconductor cell. The holders 125 attach the sections of the cell between the respective folding axes 310a-310d. After the cleaving of the semiconductor cell 110 along the folding axes 310a-310d, the cleaved cell parts 110a-110e of the semiconductor cell 110 are transferred by the holders 125. Each cell part 110a to 110d are moved along the transport direction 312 by the respective holder 125 to further process devices (not shown) to manufacture shingled solar cell arrangements. According to embodiments described herein, a separated cell part can be understood as a shingled solar cell element, wherein a plurality of shingled solar cell elements can be arranged or grouped together to form a shingled solar cell arrangement. Typically, a shingled solar cell element described herein may has a lengths less than 10 cm, or more typically has a length between 5 cm and 2 cm. The width of a shingled solar cell element may be less than 18 cm, or the width maybe between 16 cm and 14 cm.

Shingled solar cell arrangements can increase an output power of a solar cell arrangement. The increase of an output can be affected by a quality of a manufacturing process, such as a quality of the elements used to assemble the shingled solar cell arrangement. Further, a proper assembling of the shingled solar cell arrangement can be cumbersome, and a throughput and/or yield can be low. The quality of the solar cell pieces used to assemble a solar cell arrangement, such as a shingled solar cell arrangement, can improve and can increase the efficiency. The shingled solar cell arrangement can include a plurality of overlapping solar cell pieces produced by apparatuses described herein. Typically, a shingled solar cell arrangement may include more than 2 or more than 5 ore even more than 10 solar cell pieces.

The embodiments of the present disclosure allows to improve the separating e. g. the cleaving procedure of a semiconductor cell. In particular, the present disclosure can speed up and facilitate the cleaving process of a semiconductor cell, in particular a solar cell, into pieces, which can be used for producing a shingled solar cell arrangement. Separating the cell by displacing a first section relative to a second section of the semiconductor cell can facilitate the separation process of the cell, wherein the separation process can speed up. The holding arrangement including a first and a second holder section can either support or facilitate the separation process by exerting a holding force on the respective sections or support the single sections of the semiconductor cell after the separation process. According to some embodiments of the apparatus described herein, the separation process of the cell can be more efficient by separating a plurality of cell sections simultaneously.

In the following, various aspects of the present disclosure shall be summarized in the following numbered clauses.
1. An apparatus for separating a semiconductor cell, the apparatus comprising: a holding arrangement comprising a first holder section and a second holder section, the first holder section being configured to support a first section of the semiconductor cell, and the second holder section being configured to support a second section of the semiconductor cell, and
a displacement arrangement configured to separate the first section of the semiconductor cell from the second section of the semiconductor cell by displacing the first section relative to the second section.
2. The apparatus according to clause 1, wherein the displacement arrangement comprises two or more members having a support surface for supporting the first and the second section of the semiconductor cell, each member being linked to each other and being mutually displaceable.
3. The apparatus according to clause 1 or 2, wherein the holding arrangement is arranged at the displacement arrangement.
4. The apparatus according to any of clauses 1 to 3, wherein the holding arrangement comprises three or more holders sections being configured to support three or more sections of the semiconductor cell, and the displacement arrangement being configured to displace three or more sections of the semiconductor cell relative to each other.
5. The apparatus according to any of clauses 1 to 4, wherein the first holder section and the second holder section are configured to form attachment zones with a surface of the semiconductor cell, in particular at the bottom of cell.
6. The apparatus according to any of clauses 1 to 5, wherein the first and the second holder section are individually movable.
7. The apparatus according to clauses 1 to 6, wherein the displacement arrangement comprises a flexible strip.
8. The apparatus according to any of clauses 1 to 7, wherein the apparatus comprises at least one solar cell scribing device.
9. A system for producing at least one shingled solar cell arrangement, comprising:
an adhesive applying device for applying glue on the surface of an semiconductor cell;
a scribing device;
an apparatus for separating the semiconductor cell of any of clauses 1 to 7; and
a transporting configuration for semiconductor cells forming a transport connection between the adhesive applying device, the perforation device and the apparatus for separating the semiconductor cell.
10. Semiconductor cell separation apparatus, comprising:
a displacement arrangement having a first support surface and a second support surface,
a first holder section arranged on the first support surface, and
a second holder section arranged on the second support surface,
wherein the first support surface is displaceable relative to the second support surface.
11. A method for separating a semiconductor cell, the method comprising:
attaching a first section of the semiconductor cell to a first holder section and a second section of the semiconductor cell to a second holder section, and
separating the semiconductor cell by displacing the first supported section relative to the second supported section of the semiconductor cell.
12. The method according to clause 11, wherein the first and the second section of the semiconductor cell are displaced by bending the semiconductor cell.
13. The method according to clause 11 or 12, wherein the separated first and second section of the semiconductor cell are transferred away from each other individually by the first and the second holder section.
14. The method according to any of clauses 11 to 13, wherein the semiconductor cell is scribed to define the first and the second section of the semiconductor cell.
15. The method according to any of clauses 11 to 14, wherein the semiconductor cell is transferred to the holding arrangement by a conveyor.

While the foregoing is directed to some embodiments, other and further embodiments may be devised without departing from the basic scope, and the scope is determined by the claims that follow.

The invention claimed is:

1. A method for cleaving a semiconductor cell, the method comprising:
    Attaching at least a first section of the semiconductor cell to a first holder, attaching a second section of the semiconductor cell to a second holder and attaching a third section of the semiconductor cell to a third holder to form a holding arrangement comprising a first supported section, a second supported section and a third supported section, wherein the first holder, the second holder and the third holder are discrete holders, wherein the first holder, the second holder, and the third holder are each individually movable; and
    cleaving the semiconductor cell by individually moving at least the first holder and the second holder to rotate the first supported section relative to the second supported section of the semiconductor cell.

2. The method according to claim 1, wherein the separated first and second section of the semiconductor cell are transferred away from each other individually by the first and the second holder.

3. The method according to claim 1, wherein the semiconductor cell is one of scribed, perforated, scratched or laser treated to define the first and the second section of the semiconductor cell.

4. The method according to claim 1, wherein the semiconductor cell is transferred to the holding arrangement by a conveyor.

5. The method of claim 1, wherein the first holder and the second holder are each configured to support a bottom surface of the semiconductor cell.

6. The method of claim 1, wherein the first holder section, the second holder and the third holder are configured to form attachment zones with a surface of the semiconductor cell.

7. The method of claim 1, wherein the first holder, the second holder and the third holder are displaced simultaneously.

8. The method of claim 1, wherein attaching the first section of the semiconductor cell to the first holder and the second section of the semiconductor cell to the second holder is done by applying a holding force to the first section and the second section selected from the group consisting of a mechanical force, a negative pressure or an electromagnetic force.

9. The method of claim 8, wherein the holding force is applied to one or any combination of the following: an edge surface, an upper side surface or a bottom side surface of the semiconductor cell.

10. The method of claim 1, further comprising applying an adhesive to one of the group consisting of the semiconductor cell and the first and second section.

* * * * *